United States Patent
Li et al.

(10) Patent No.: US 6,620,215 B2
(45) Date of Patent: Sep. 16, 2003

(54) ABRASIVE COMPOSITION CONTAINING ORGANIC PARTICLES FOR CHEMICAL MECHANICAL PLANARIZATION

(75) Inventors: Yuzhuo Li, Potsdam, NY (US); Guomin Bian, Toronto (CA); Kwok Tang, Mississauga (CA); Joe Zunzi Zhao, Potsdam, NY (US); John Westbrook, Albany, NY (US); Yong Lin, Potsdam, NY (US); Leina Chan, Toronto (CA)

(73) Assignee: Dynea Canada, Ltd., Mississauga (CA)

( * ) Notice: Subject to any disclaimer, the term of this patent is extended or adjusted under 35 U.S.C. 154(b) by 0 days.

(21) Appl. No.: 10/023,827

(22) Filed: Dec. 21, 2001

(65) Prior Publication Data

US 2003/0136055 A1 Jul. 24, 2003

(51) Int. Cl.$^7$ .............................. C09K 3/14; C09G 1/02; C09G 1/04
(52) U.S. Cl. .............................. 51/298; 51/307; 51/308; 51/309; 106/3; 438/692; 438/693
(58) Field of Search .................... 51/298, 307, 308, 51/309; 106/3; 438/692, 693; 523/149; 528/86, 129, 162, 211, 230

(56) References Cited

U.S. PATENT DOCUMENTS

| | | | |
|---|---|---|---|
| 3,928,949 A | | 12/1975 | Wagner |
| 4,255,164 A | | 3/1981 | Butzke et al. |
| 4,954,140 A | | 9/1990 | Kawashima et al. |
| 5,368,619 A | | 11/1994 | Culler |
| 5,627,261 A | * | 5/1997 | Albrecht et al. ............ 524/843 |
| 6,312,486 B1 | * | 11/2001 | Sandhu et al. .................. 106/3 |
| 6,352,471 B1 | * | 3/2002 | Bange et al. ................ 451/527 |
| 6,375,545 B1 | * | 4/2002 | Yano et al. ................... 451/36 |

FOREIGN PATENT DOCUMENTS

| | | |
|---|---|---|
| DE | 23 66 256 C2 | 8/1983 |
| DE | 199 51 250 A | 5/2001 |
| EP | 919602 A1 * | 6/1999 |
| EP | 1 036 836 A1 | 9/2000 |
| EP | 1 078 717 A2 | 2/2001 |
| EP | 1 104 778 A2 | 6/2001 |
| EP | 1123956 A1 * | 8/2001 |
| GB | 1 399 673 A | 7/1975 |
| GB | 2261182 A * | 5/1993 |
| JP | 08003542 A | 1/1996 |
| WO | WO 99/53532 A1 | 10/1999 |

OTHER PUBLICATIONS

Database WPI Section Ch, Week 200272 Derwent Publications Ltd., AN 2002–675154 XP002233424 & WO 02 070576 A (Nissan Chem Ind Ltd), Sep. 12, 2002, abstract.

Database WPI Section Ch, Week 197831 Derwent Publications Ltd., AN 1978–56449A, XP002233425 & SU 573 337 A (Urals Abrasives Pol), Oct. 11, 1977, abstract.

Database WPI Section Ch, Week 198924 Derwent Publications Ltd., AN 1989–175855, XP002233426 & JP 01 115575 A (Tohoku Metal Ind Ltd), May 8, 1989, abstract.

Database WPI Section Ch, Week 198534 Derwent Publications Ltd., AN 1985–206783, XP002233427, & JP 60 130698 A (Lion Corp), Jul. 12, 1985, abstract.

* cited by examiner

Primary Examiner—Michael Marcheschi
(74) Attorney, Agent, or Firm—Birch, Stewart, Kolasch & Birch, LLP

(57) ABSTRACT

The present invention is drawn to a composition comprising abrasive particles comprising an organic resin for chemical mechanical planarization (CMP), which can be widely used in the semiconductor industry. The abrasive composition is an aqueous slurry comprising abrasive particles comprising an organic resin, wherein the slurry is held at a pH in the range of 2–12. An attractive feature of the inventive abrasive composition is that it can be tailored to selectively remove different components from the surface. The inventive abrasive composition also provides efficient polishing rates and good surface quality when used in CMP applications.

11 Claims, No Drawings

ABRASIVE COMPOSITION CONTAINING ORGANIC PARTICLES FOR CHEMICAL MECHANICAL PLANARIZATION

FIELD OF THE INVENTION

The present invention comprises an abrasive composition for chemical mechanical planarization (CMP), which contains abrasive particles comprising an organic resin; methods of preparing the organic resin particles; methods of tailoring the abrasive composition for selective CMP applications; and a method of preparing a semiconductor device using the abrasive composition.

BACKGROUND OF THE INVENTION

CMP is a commonly used technology in semiconductor industry. The pure substrate surface and complex surface of semiconductor wafer, dielectric layer, conducting wire and barrier materials in the integrated circuits have to be polished to achieve a certain degree of planarity, which is extremely important to reach a high density of integrated circuits. In general, CMP technology consists of four major specific technologies including slurry, pad, polisher and post-cleaning device. The CMP slurry provides a chemical environment to wet and adjust the interaction between abrasive, pad and the wafer surface, and also moderates the mechanical force on the polishing surface. The slurry plays a key role in CMP process and determines the production efficiency and product quality.

The present invention relates generally to the preparation of semiconductor devices and more particularly to improved slurry compositions for the chemical-mechanical planarization (CMP) of metal (e.g., Cu) layers and barrier materials (e.g., Ta, TaN, etc.) and dielectric materials for their polishing.

A semiconductor wafer typically includes a substrate, such as a silicon wafer, on which a plurality of integrated circuits have been formed. In the manufacture of integrated circuits, wafer surface planarity and quality is of extreme importance. In order to achieve the degree of planarity required to produce ultra high density integrated circuits, CMP processes are being employed.

In general, CMP involves pressing a semiconductor wafer against a moving polishing surface that is wetted with a chemically reactive, abrasive slurry. Conventional slurries either are acidic or basic, and generally contain alumina, silica, zirconium oxide, magnesium oxide, or cerium oxide abrasive particles. The polishing surface usually is a planar pad made of a relatively soft, porous material, such as polyurethane. The pad usually is mounted on a planar platen. Continuous pad devises also are being tested. Systems devoid of a slurry where the pad contains the abrasive also are being used.

Integrated circuits are chemically and physically integrated into a substrate by patterning regions in the substrate and layers on the substrate. The layers generally are formed of various materials having either a conductive, insulating, or semiconducting nature. Also, barrier materials or barriers are used to prevent the migration of ions and adhesion promoters. In order for a device to have high yields, it is crucial to start with a flat semiconductor wafer. If the surface is not: uniform (e.g., areas of unequal elevation or surface imperfections), various problems can occur which may result in a large number of inoperable devices. Further details can be found in the following references: Luo, et al., "Chemical-Mechanical Polishing of Copper: A Comparative Analysis," February 13–14 CMP-MIC Conference, 1997 ISMIC—200:197/0083; Babu, et al., "Some Fundamental and Technological Aspects of Chemical-Mechanical Polishing of Copper Films: A Brief Review," Feb. 19–20, 1998 CMP-MIC Conference, 1998 IMIC—300P98/0385; Tseng, et al., "Effects of mechanical characteristics on the chemical-mechanical polishing of dielectric thin films," Thin Solid Films, 290–291 (1996) 458–463; Nanz, et al., "Modeling of Chemical-Mechanical Polishing: A Review," IEEE Transactions on Semiconductor Manufacturing, Vol. 8, No. 4, November 1995; Stiegerwald, et al., "Pattern Geometry Effects in the Chemical-Mechanical Polishing of Inlaid Copper Structures,": "J. Electrom. Soc., Vol 141, Oct. 10, 1994; Fury, "Emerging developments in CMP for semiconductor planarization—Part 2," Solid State Technology, 81–88, July 1995; Fury, "CMP Standards: A Frustration Cure," Semiconductor International, November 1995.

Surface planarity is of paramount importance in microelectronics. With the integrated technology approaching the era of Ultra Large Scale Integration (ULSI), CMP is touted as the only viable technique to meet today's planarity requirements. Some of the most important issues in CMP today addressed to dishing and erosion, corrosion, defects of the surface, include the control of polishing rate and selectivity among different materials on the surface. The prior art attempts to accomplish these goals as follows.

U.S. Pat. No. 4,959,113 discloses a method of polishing metal surfaces with aqueous slurries. The slurry composition comprises water, abrasives such as $SiO_2$, $Al_2O_3$, $TiO_2$, $ZrO_2$, $CeO_2$, $SnO_2$, SiC, TiC, and a salt containing any cation of group IIA, IIIA, IVA, or IVB and any anion of chloride, bromide, iodide, nitrate, sulfate phosphate, or perchlorate. The patent also discloses a pH range of 1–6 which is adjusted with mineral acids.

U.S. Pat. No. 5,084,071 discloses the CMP slurry, which comprises abrasive particles, e.g. $SiO_2$, $CeO_2$, $Fe_2O_3$, SiC, $Si_3N_4$, containing less than 1%(w/w) of alumina, and a transition metal chelated salt (e.g. EDTA) as a polishing accelerator.

U.S. Pat. No. 5,114,437 discloses the CMP slurry for polishing an aluminum substrate, which contains an alumina with an average particle size of 0.2–0.5$\mu$, and a polishing accelerator selected from the group consisting of chromium (III) nitrate, lanthanum nitrate, ammonium cerium (III) nitrate and neodymium nitrate.

U.S. Pat. No. 5,209,816 discloses a method for polishing Al- or Ti-containing metal layer with the CMP slurry, which contains inorganic abrasive materials, 0.1–20% by volume of $H_3PO_4$ and 1–30% by volume of $H_2O_2$.

U.S. Pat. No. 5,225,034 discloses the CMP slurry for polishing copper layer on a semiconductor wafer to produce copper wire on the wafer. The slurry comprises $AgNO_3$, inorganic abrasive particles and an oxidant selected from $H_2O_2$, HClO, KClO, $K_2MnO_4$, or $CH_3COOOH$.

U.S. Pat. No. 5,340,370 discloses the CMP slurry for polishing tungsten or tungsten nitride film, which comprises an oxidizing agent such as potassium ferricyanide, inorganic abrasive particles, water, and has a pH of 2–4.

U.S. Pat. No. 5,366,542 discloses a CMP slurry comprising alumina abrasive particles, chelating agent selected from the group consisting of polyaminocarboxylic acid (EDTA) and sodium or potassium salts, and may further contain boehmite or an aluminum salt.

U.S. Pat. No. 5,391,258 discloses a CMP slurry for polishing silicon, silica or silicate composite. The slurry comprises, in addition to inorganic abrasive particles, hydrogen peroxide and potassium hydrogen phthalate.

U.S. Pat. No. 5,516,346 discloses a CMP slurry for titanium film. The slurry contains potassium fluoride, inorganic abrasive particles such as silica, and pH<8.

U.S. Pat. No. 5,527,423 discloses the slurry for polishing a metal layer, which comprises an oxidizing agent such as iron nitrate, alumina particles containing at least 50% gamma phase, nonionic surfactants such as polyalkyl siloxanes, or polyoxyalkylene ethers.

U.S. Pat. No. 6,171,352 discloses a CMP slurry which contains, in addition to inorganic abrasive particles, an abrasion accelerator, wherein the abrasion accelerator comprises monocarboxy group- or an amino group-containing compound and optionally a nitrate salt, also a viscosity modifier such as polyacrylic acid or its copolymer.

U.S. Pat. No. 6,258,721 discloses an innovative CMP slurry using diamond particles as an abrasive material, comprising ingredients such as an oxidizing agent, chelating agent, surfactant and others.

In summary, all reported CMP slurries employ inorganic particles as abrasive materials and as such, cannot achieve the combination of an efficient polishing rate and selectivity for removing different materials from the surface. The present invention provides a novel CMP slurry that uses abrasive particles comprising an organic resin. The functionality and density of the organic particles is adjustable to control the interaction between particles and the wafer surface, that effects unique properties for CMP applications that are not available with conventional slurries containing inorganic abrasive particles.

SUMMARY OF INVENTION

An objective of the present invention is to provide a new CMP composition, in which the abrasive particles have tailored functionality. By varying the functionality of the particles, the interaction between the particles and the substrate surface can be controlled.

A second objective of the present invention is to decrease the hardness of abrasive particles to reduce surface scratch, which leads to wafer defect reduction and an improved post CMP cleaning step. In addition, this invention uses abrasive particles that are significantly low in density, which leads to a much more stable slurry, i.e., they do not show sedimentation of particles to the bottom of the container on standing.

The present invention, in part, is drawn to a CMP slurry comprising soft water with 0.1–20 w/w % of abrasive particles comprising an organic resin, wherein the CMP slurry is maintained at a pH between 2–12. The CMP slurry may further comprise 0.1–20 w/w % of oxidizing agent, 0.05–15 w/w % of surfactant, 0.1–15 w/w % of chelating agent, 0.001–10 w/w % of passivation agent and 0.1–20 w/w % of inorganic abrasive particles.

The present invention, in part, is drawn to a slurry (A) which can be used to selectively remove copper from a surface. This slurry comprises 0.5–20 w/w % of abrasive particles comprising an organic resin, 0–10 w/w % of an oxidizing agent, 0.1–5 w/w % of a chelating agent, 0.1–5 w/w % of surfactant, 0–1 w/w % of a passivation agent and soft water. The pH of the solution is in the range of 2–12.

The present invention, in part, is drawn to a slurry (B) which can be used to effectively remove tantalum found in barrier films and/or silica. Slurry (B) comprises 0.5–20 w/w % of the abrasive particles comprising an organic resin, 0–3 w/w % of an oxidizing agent, 0–3 w/w % of a chelating agent, 0–2 w/w % of a surfactant, 0.1–15 w/w % of inorganic abrasive particles and soft water. Slurry (B) is maintained at a pH of 2–12.

The present invention, in part, is drawn to a method for preparing the abrasive particles comprising an organic resin, said method comprising combining soft water with a substituted or unsubstituted formaldehyde, and at least one of (a) a substituted or unsubstituted melamine, (b) a substituted or unsubstituted urea, (c) a substituted or unsubstituted phenol and (d) a substituted or unsubstituted resorcinol; an optional step of adjusting the pH of the mixture to a desired value; curing the resin; and grinding the cured resin into particles having an average diameter of 0.05–5 microns.

Also, the present invention, in part, is drawn to a method of preparing a semiconductor device using the inventive abrasive slurry composition.

DETAILED DESCRIPTION OF THE INVENTION

Organic Abrasive Particles

The present invention, in part, is drawn to abrasive particles comprising an organic resin having a hardness of less than 250 on the Rockwell Hardness scale (ASTM D785). Preferably, the hardness is from 65 to 125. The organic abrasive particles are formed of resins and can be tailored to control the interaction between the particles and the polishing substrate surface. The functionality and density of the resin particles are properties which affect this interaction between the particles and the polishing substrate surface. Thus, varying the functional groups on the resin and controlling the process for preparing the resin enables one to selectively remove individual components from a surface containing multiple components. The density of the abrasive particles is 1.2–1.6 g/cm$^3$.

The present invention, in part, is drawn to a method of preparing the abrasive particles comprising an organic resin, said method comprising mixing soft water with a substituted or unsubstituted formaldehyde, and at least one of (a) a substituted or unsubstituted melamine, (b) a substituted or unsubstituted urea, (c) a substituted or unsubstituted phenol and (d) a substituted or unsubstituted resorcinol; optionally varying the pH of the mixture to a desired value; curing the resin; and grinding the cured resin into particles having an average diameter of 0.05–5 microns.

The term "substituted urea" as used herein includes urea molecules wherein the hydrogen atom on the amino group is substituted by an alkyl, aryl, alcohol, carbonyl or any other functional group. The degree of substitution is at least one.

The term "substituted melamine" as used herein includes melamine molecules wherein the hydrogen atom on the amino group is substituted by an alkyl, aryl, alcohol, carbonyl or any other functional group. The degree of substitution is at least one.

The terms "substituted phenol" and "substituted resorcinol" as used herein include phenol and resorcinol molecules, respectively, wherein the hydrogen atom on the phenyl group is substituted by an alkyl, aryl, alcohol, carbonyl or any other functional group. The degree of substitution is at least one.

Thus, the "organic abrasive particles" are composed of a formaldehyde-based resin or combination of formaldehyde-based resins such as melamine formaldehyde, substituted melamine formaldehyde, urea formaldehyde, substituted urea formaldehyde, phenol formaldehyde, substituted phenol formaldehyde, resorcinol formaldehyde, and substituted resorcinol formaldehyde. The formaldehyde-based resin(s) can be mixed with other thermoplastic polymer(s) and/or rubber(s).

The relative ratio of the formaldehyde monomers to the other monomers has an effect on the selectivity of the slurry composition.

The water used in the process of forming the formaldehyde-based resin and in the abrasive slurries is preferably "soft". The term "soft" as used herein means that the water has less than 500 ppm heavy metal impurities. Preferably, the soft water has less than 50 ppm heavy metal impurities. Salts and other impurities that do not significantly reduce the yield of the formaldehyde resins or significantly effect the polishing process of the abrasive slurry, do not necessarily need to be removed from the water prior to the polymer synthesis step.

The following examples are provided by way of illustration to show how the inventive organic abrasive resin material can be prepared and should not be construed as limiting the invention in any way.

EXAMPLES

Example-1

Resin A is prepared as follows: A reactor is charged with 185 parts of demineralized water, 1404 parts of formaldehyde (52.2%) and 12.5 parts of triethanolamine under agitation. The pH is adjusted to 9.0 and charged with 878 parts of melamine. The mixture is heated to refluxing as soon as possible, and is maintained at refluxing for 5 minutes. The mixture is cooled down to 80–82° C. and maintained at 80–82° C. The pH is monitored and kept to 9.0–9.4 with potassium hydroxide (25% solution). When the water miscibility reaches 120–140%, the mixture is charged with 5 parts of potassium hydroxide (25% solution) and cooled down to room temperature. The resin is cured in the oven at 165° C. for 90 minutes. After curing, the resin is ground to a desired particle size in the range of 0.1–0.5$\mu$.

Water miscibility is defined as the amount of water (by weight) needed to cause a resinous liquid to become turbid, expressed as a %. For example, if it takes 5 grams of water to cause 10 grams of resin to turn turbid, then the water miscibility is 50%. In other words, water miscibility=(weight of water that causes turbidity/weight of resin)×100%.

Example-2

The preparation procedure for resin B is similar to Example-1. The difference is the formaldehyde/melamine molar ratio, which is changed from 3.5 to 2.5. The synthesis, curing and grinding procedures are the same as described in Example-1.

Example-3

Resin C is a low mole ratio melamine formaldehyde resin. A typical preparation procedure is following: A reactor is charged with 1194 parts of demineralized water, 45 parts of diethylene glycol, 13.5 parts of amine and 1313 parts of formaldehyde (50%) under agitation. Adjust the pH to 9.2 and charge 1748 parts of melamine followed with 60 parts of demineralized water. Heat the reaction mixture to refluxing. Keep the reaction at refluxing temperature for 10–20 minutes and cool to 80° C. Maintain the pH in the range of 9.0–9.4 with KOH and maintain the reaction mixture at 80° C. until water miscibility reaches 60%. Charge 2 parts of amine to pH 9.4–9.6 and then cool the reaction mixture to room temperature. The curing and grinding procedures are the same as described in Example-1.

Example-4

Resin D is a copolymer of melamine and urea formaldehyde. To prepare the resin, charge 1304 parts of formaldehyde (50%), 1066 parts of demineralized water and 40 parts of diethyleneglycol into a reactor with agitation. Adjust pH to 9.0 with potassium hydroxide (25% solution), then charge 187 parts of urea, 1310 parts of melamine and 89 parts of demineralized water into the reactor. Heat the reaction mixture to 80° C. and maintain the temperature until water miscibility reaches 220%. Cool the reaction mixture to room temperature and adjust the pH to 9.8. The curing and grinding procedures are the same as described in Example-1.

Example-5

Resin E is copolymer of melamine formaldehyde and phenol formaldehyde. Melamine formaldehyde resin was prepared using a similar procedure as described in Examples 1 and 2 except the fact that the mole ratio is changed to 1.65. Phenol formaldehyde resin was prepared as follows: charge 47.6% of phenol, 3% of potassium hydroxide (25% solution) and 16% of formaldehyde (52%) into reactor. Let temperature rise to 75° C. and start to load 47% of formaldehyde (52%) slowly at 75° C. Continue the reaction at 80–90° C. until water miscibility reaches 180–200%, then cool to room temperature. Mix 2 parts of melamine formaldehyde resin with 1 part of phenol formaldehyde. The curing and grinding of the resin procedure are the same as described in Example 1.

Example-6

Resin F is an urea formaldehyde resin, which is prepared as follows: charge 67% of formaldehyde (52.2%) and adjust pH to 5.6–5.8. Charge 5% of ammonia(aq) and react for 20 minutes. Load 28% of urea and heat to 95° C. React at 80–95° C and pH of 5.4–5.8 until viscosity reaches about 2000 cps, then cool to 65° C. Adjust pH to 6.7–7.0 and load 12% of urea at 65° C. Mix for 10 minutes and start vacuum distillation to remove about 14% water from the liquid resin. Cool to room temperature and adjust pH to 7.5–7.7. The resin was cured and ground as in Example-1.

Viscosity is measured with a Brookfield viscometer at 25° C. The measurement is expressed in centipoise (cps).

Example-7

Resin G is a phenol formaldehyde resin and prepared as follows: charge 58.6% of phenol and 1.8% of potassium hydroxide (50% solution) into the reactor. At 58–60° C., start loading 53.7% of formaldehyde (52.2%) slowly. After loading formaldehyde, continue the reaction at 65–70° C. until the water miscibility reaches 350%, then cool to room temperature. Cure and grind as per Example-1.

Example-8

Resin H is the copolymer of phenol urea formaldehyde. Urea formaldehyde resin is prepared as resin F. Phenol formaldehyde resin is prepared as follows: charge 25% of phenol, 33% of formaldehyde and 34% of water. Mix and cool to 40° C. Slowly charge 3% of potassium hydroxide (50% solution) and control the temperature to be lower than 60° C. Gradually increase the temperature to 90° C. and react until viscosity reaches "B–C" (G–H viscometer). Cool to 72° C. and continue the reaction to viscosity "L–M". Cool to 40° C. and charge 5% of urea and mix for about 30 minutes, then continue cooling to room temperature. Take 1 part of phenol formaldehyde resin and blend well with 1 part of resin G. The blended resin was cured and ground as in Example-1.

A G–H viscometer is a Gardner-Holdt bubble viscometer. A sample is placed inside a bubble tube and adjusted to 25° C. in a water bath. The speed of rise of the bubble when the tube is inverted is compared to standards. The scale follows the English alphabet, from A to Z. "A" is the lowest viscosity and "Z" is the highest viscosity. "B–C" means that the viscosity of the sample being measured is between standards "B" and "C", likewise for "L–M".

Example-9

Resin I was prepared with an emulsion method as disclosed in Example 5 of Tang et al. U.S. Pat. No. 6,245,853.

Example-10

Resin J was prepared from a spray-dried powder resin of melamine formaldehyde and then cured in the oven, ground as in Example-1. The initial liquid resin (prior to spray drying) was prepared as follows: load 28884 parts of water and 56 parts of sodium carbonate into a reactor. Heat to 50° C. and load 36475 parts of melamine. At 50° C., load 34585 parts of formaldehyde and heat to 95° C. Maintain the pH to greater than 9.1 during the reaction. When water miscibility reaches 190–210%, cool to 85° C. Continue reaction at 85° C. until water miscibility reaches 20–25% and then cool to room temperature. The liquid resin was spray-dried at an inlet temperature of 180–200° C. and an outlet temperature of 70–100° C. The powder resin was baked in the oven at 165° C. and then ground to desired particle size.

Slurry Composition

The present invention, in part, is drawn to a slurry composition for CMP applications, comprising 0.1–20 w/w % of abrasive particles comprising an organic resin, wherein the slurry is maintained at a pH of 2–12. This slurry may further comprise at least one of a surfactant, an oxidizing agent, chelating agent, passivation agent and inorganic abrasive particles.

When the surfactant is used, it is generally added in a concentration of 0.05–10 w/w % based on the weight of the composition. Preferably the surfactant is added in a concentration of 0.05–3 w/w %. More preferably, the concentration is 0.05–0.15 w/w %. The surfactant can be either ionic or non-ionic, however, a non-ionic surfactant is preferred. Any non-ionic surfactant known in the art can be used. Examples of surfactants which can be used include alkylated polyethylene oxide, alkylated cellulose, alkylated polyvinyl alcohol, alkyl or aryl carboxylic acid, sulfate or ammonium salt.

The oxidant used in the inventive abrasive composition, can be any suitable commercial oxidant, such as peroxides ($H_2O_2$), chlorates ($ClO_3$), chlorites, perchlorates, bromates, bromites, perbromate, nitrates ($FeNO_3)_3$), $K_2S_2O_8$, $KIO_3$, $K_2MnO_4$, hypochlorites, $KMgO_4$, and $CH_3COOH$, or any mixture thereof. The concentration of the oxidizing agent depends upon the strength of the oxidizing agent. When the oxidizing agent is used, it is added to the slurry in a concentration of 0.1–10 w/w % based on the weight of the slurry. Preferably, the concentration is 0.1–3 w/w %.

It is highly desirable to improve the selectivity of metal planarization as much as possible. Further improvements in CMP planarization of dielectric/metal composite structures can be obtained by the addition of a chelating agent to the slurry which is selective for the metal component of interest. This results in a further increase in the corrosion rate of the metal phase and increased selectivity of metal versus dielectric phase removal, making the planarization process much more efficient.

The chelating agent to be used in the present invention is a compound which has a multidentate ligand to form a chelate compound with a metal ion. A water soluble chelating agent is generally used in the present invention, and is preferably a polyamine, polyaminocarboxylic acid and/or an amino acid. The most preferred being an amino acid. Examples of the polyamine include ethylenediamine, 2,2'-bipyridine, and diethylenetriamine. Examples of the polyaminocarboxylic acid include nitrilotriacetic acid, ethylenediamine-tetraacetic acid, and diethylenetriamine-pentaacetic acid, and sodium or potassium salts thereof. Glycine is an example of an amino acid chelating agent.

When the chelating agent is used, it is added in an amount of 0.05–5 w/w % based on the weight of the slurry composition. Preferably the concentration is 0.1–3 w/w %. Most preferably, the concentration is 0.1–1 w/w %. With an excessively small amount, the chelating agent does not produce the intended effect of the invention; and within excessively large amount, the chelating agent is wasteful without any additional effect.

The CMP slurry may further comprise a passivating agent. When the passivating agent is used, it is generally added in the range of 0.001–1 w/w % based on the weight of the slurry composition. Preferably, the passivation agent is in a concentration of 0.01–0.5 w/w %. Most preferably, the concentration is 0.01–0.05 w/w %. The purpose of the passivating agent is to control the etch rate of at least one of the features. For the etching of copper, an effective passivating agent is a phosphate. The phosphate may be, for example, dilute phosphoric acid or ammonium phosphate which is added in an effective amount sufficient for passivation. The passivation agent can also be an organic compound containing two or more hetero-elements such as nitrogen, sulfur, phosphorus, and oxygen.

In general, all benzotriazole (BTA) or benzothiazole compounds can be used as copper film passivating agents. Some representative examples include, but are not limited to 1H-benzotriazoleacetonitrile, benzotriazole-5-carboxylic acid, 2(3H)-benzothiazolone, and 1H-benzotriazole-1-methanol.

The CMP slurry may also contain inorganic abrasive particles. Generally, the inorganic abrasive particles are added in a concentration of 0.1–10 w/w % based on the weight of the slurry. Preferably, the concentration is 0.5–5 w/w %. More preferably, the concentration is 0.5–2 w/w %. The abrasive agent can be formed of any inorganic particles, as long as the hardness is in a range of 1,200 to 10,000 $kg/mm^2$ (as measured by atomic force microscopy). The inorganic abrasive agent includes at least one of $SiO_2$, $Al_2O_3$, $ZrO_2$, $CeO_2$, $SiC$, $Fe_2O_3$, $TiO_2$, $Si_3N_4$ and diamond.

The hydrogen ion concentration of the CMP slurry is pH 1–13, preferably 2–12, and most preferably 4–10. The pH is adjusted with an acid or base. Acids include any mineral acids such as sulfuric acid, hydrochloric acid, and nitric acid, or organic acids such as acetic acid. The base is an alkaline earth metal hydroxide, ammonia or an organic amine. The pH can also be maintained by adding a buffer solution.

The particles comprising an organic resin that are used in the CMP slurry can be formed by the process as described, supra, or by a conventional process such as that described in Tang et al., U.S. Pat. No. 6,245,853, which is herein incorporated by reference in its entirety. The abrasive particles are added in a concentration of 0.1–20 w/w % based on the weight of the slurry. Preferably, the abrasive particles are added in a concentration of 1–15 w/w %. More preferably, the concentration is 1–5 w/w %. The organic resin particles are used in a range of 0.05–5 microns. Preferably the particle size is 0.05–1 micron. Most preferably, the particle size in a range of 0.1–0.5 micron.

A problem associated with the use of inorganic particles in CMP slurries, is that the inorganic particles generally have jagged edges which cause unacceptable scratching of the surface of the substrate. Often a separate step is required to reduce the jagged edges of these inorganic particles, such as by milling the particles. It is contemplated as part of the present invention to reduce the jagged edges of these inorganic particles by polymerizing a mixture comprising monomers and the inorganic particles thereby forming a polymeric continuous phase comprising the inorganic particles. This material is then ground to an appropriate particle size to give organic resin coated inorganic particles.

The polishing composition of the present invention may be incorporated with the following known additives depending upon the type of the object to be polished or upon the conditions for the polishing operation.

Examples of the additives include water-soluble alcohols such as ethanol, propanol, and ethylene glycol; organic polyanionic substances such as lignin sulfonate, carboxymethylcellulose salt, and polyacrylate; celluloses such as cellulose, carboxymethyl cellulose, and hydroxyethyl cellulose; and inorganic salts such as ammonium sulfate, ammonium chloride, ammonium acetate and magnesium nitrate.

The polishing composition of the present invention may be produced as a stock of high concentration which is diluted at the time of use. The above-mentioned concentration is applied to the polishing composition ready to use.

The polishing composition of the present invention is used for the polishing of metal, glass, and plastics. It is particularly suitable for the polishing of memory hard disk because of its ability to provide a defect-free polished surface.

Depending upon the complexity of the substrate to be polished, it is possible to use a first slurry which selectively removes one component from the substrate, and then use a second slurry which has been tailored to remove a second component from the substrate. Typically, after each polishing stage, there is a cleaning stage.

The technique of CMP planarization and cleaning operations are practiced in conventional fashion, such as can been found in the literature. In this regard, the following references are representative: "CMP Grows in Sophistication", Semiconductor International, November 1998 Cover Story, Ruth Dejule, Associate Editor; Sethuraman, "CMP—Past, Present and Future", Future Fab, Issue 5 (Mar. 10, 1999); and "Slurries and Pads Face 2001 Challenges", Semiconductor International, Alexander E. Braun, Associate Editor, November 1998.

The CMP slurry composition can be tailored to selectively remove different components from a substrate. For example, a slurry (A) which is effective for removing copper from a substrate while having a minimal effect on tantalum components comprises: (1) 0.5–20 w/w % of abrasive particles comprising an organic resin, preferably 1–5 w/w %; (2) 0–10 w/w % of an oxidizing agent, preferably 1–3 w/w %; (3) 0.1–5 w/w % of a chelating agent, preferably 0.1–1 w/w %; (4) 0.1–5 w/w % of a surfactant, preferably about 0.1 w/w %; and (5) 0–1 w/w % of a passivation agent, preferably 0–0.05 w/w %, each value based on the weight of the slurry composition, and the balance being soft water with a pH maintained in a range of 2–12, preferably 2–6.

The CMP slurry composition can be tailored to polish components such as barrier films of tantalum while having a reduced effect on copper. This slurry (slurry (B)) comprises: (1) 0.5–20 w/w % of abrasive particles comprising an organic resin, preferably 1–5 w/w %; (2) 0–3 w/w % of an oxidizing agent;(3) 0–3 w/w % of a chelating agent; (4) 0–2 w/w % of a surfactant; and (5) 0.1–15 w/w % of an inorganic abrasive particle, preferably about 1 w/w %, each value based on the weight of the slurry composition, the balance being soft water and the slurry is maintained in a pH of 2–12, preferably 9–10.

The following are examples which show how the surfactant solution, aqueous slurry (A) and aqueous slurry (B) are prepared. Also, examples of polishing using the inventive CMP slurries are described.

Example-11

To prepare a surfactant solution, add Arlasolve 200 L surfactant (manufactured by ICI Industries, 80 wt-% polyoxyethylene (20), isohexadecyl ether, 20 wt-% water, CAS #69364–63-2, supplied by Emulsion Engineering Inc, Sanford, Fla.) to deionized water in a vessel fitted with a magnetic stirring system. Agitation was continued for 10 minutes or until no surfactant was visible in the solution. Thereafter, the solution was subjected to sonication for about 25 minutes.

Example-12

To prepare aqueous slurry (A), a designated amount of organic resin particles is first dispersed in deionized water containing a formulated amount of Arlasolve 200 L surfactant as described in Example-11 and with the assistance of sonication an uniform dispersion is obtained. The slurry container is then placed on a magnetic stirrer plate and stirred for 10 minutes at 75% maximum speed. Sonication is then applied for an additional 25 minutes. The slurry container is then placed back on the magnetic stirrer and stirred at 75% maximum speed for 2 minutes. Formulated amount of other ingredients, such as glycine and hydrogen peroxide, are added into the slurry during stirring. The slurry pH is adjusted by using potassium hydroxide solution for the desired range. A typical primary slurry is formulated with a following composition: 1–3 w/w % hydrogen peroxide, 0.1–1 w/w % glycine, 1–5 w/w % organic resin particles (Resin A from Example 1), 0.1 w/w % surfactant, 0–0.05 w/w % passivation agent (BTA) and DI water.

Example-13

Slurry (B) is prepared with the following procedure: first, 1% (10 g) of silica oxide L-90 (Cabot L-90 amorphous fumed silica, CAS #1344-28-1, Cabot Industries, Tuscola, Ill.) is added to 940 ml D.I. water and stirred for about 20 minutes. After the silica oxide is completely dispersed, 5% (50 g) of organic resin particles are added into the above dispersion and stirred for another 20 minutes. Before polishing, the pH is set at 9.4.

Example-14

The disc, with 1" diameter by 0.25" thickness purchased from Kamis Inc, was mounted onto a single side polishing machine (Struers Labopol 5 Grinding Table, Serial #5200825 and Struers LaboForce 3 Force Arm, Serial #5210461, manufactured by Struers Inc, Westlake, Ohio) which had a soft polyurethane polishing pad mounted onto its lower side. Polishing is conducted for three minutes using a pressure of 6 psi with a slurry flow rate of 60 ml/minute. The disk and the pad have a relative rotating speed of 150 rpm. After polishing, the disk is removed from the polisher and ultrasonic cleaning is performed to clean the polished surface of the disk. The weight loss of the disk is measured and the average polishing rate is calculated.

Example-15

The patterned wafer (SeMaTech 926), with 1" (24 mm) diameter by 710–740 nm thickness, is attached to a carrier made of stainless-steel and then mounted on a single side polishing machine (Struers Labopol-5 Grinding Table, Serial #5200825 and Struers LaboForce Arm, Serial #5210461, manufactured by Struers Inc, Westlake, Ohio) having a soft polyurethane polishing pad mounted on the lower side of the polishing machine. Polishing is conducted for 3–5 minutes under a pressure of 6 psi by supplying the above mentioned slurry at 60 mL/minute between the wafer and the pad. The wafer and the pad have a relative rotating speed of 150 rpm. After polishing, the wafer is removed from the polisher and ultrasonic cleaning is performed to clean the polished surface of wafer. The dishing and erosion are measured using Dektak.

The DEKTAK is a microprocessor-based instrument used for making accurate measurements on very small vertical features ranging in height from less than 100 angstroms to 655,000 angstroms. DEKTAK acquires data by moving the sample beneath the diamond-tipped stylus. Vertical movements of the stylus are sensed by an LVDT, digitized, and stored in the instrument's memory. The stored information can be used to give a 3 dimensional image of the surface of the structure. The scanning parameters were set at: (A) scan length at 2 mm (2000 microns); and (B) scan speed at medium (number of samples per scan 250–500).

Dishing is a specific measurement on the copper features using the cross section of the copper layer. Scratching is the result of a random indentation and extended dragging on the field of any type of surfaces. Scratchinq is typically divided into severe scratch and microscratch. Severe scratch refers to scratches with a depth of indentation greater than 40 nm. Microscratches refer to damages with depth of indentation less than 40 nm. Preferably the CMP treated surface should have no scratch at all; however, microscratches are tolerated as they often do not result in fatal defects, i.e., defects that render the object ineffective for its intended purpose.

With the inventive resin slurries, the scratches will be severe if there is significant numbers of oversized particles (>1000 nm). If the slurry is carefully filtered and the oversized particles are removed, the scratches are mainly microscratches. When the slurry is properly formulated, a scratch free surface can be obtained with few minor microscratches (<10/mm$^2$).

Example-16

Polishing of 8" patterned wafer: Eight-inch patterned wafers (SeMaTech 926) were polished with Westech 372-M. The polishing conditions were as follows: wafer pressure (4 Psi); slurry flow rate (200 ml/min); platen speed and carrier speed (60 rpm). After polishing, the dishing and erosion were measured using Dektak.

Using a procedure set forth in Example-14, 1" discs of copper, tantalum and silica oxide were polished using slurry (A) of Example 12 with different organic resin particles, which were prepared as described in Examples 1–10. The slurry (A) was prepared with 3% $H_2O_2$, 1% glycine, 5% organic resin particle and 0.2% Arlasolve 200 surfactant. The removal rate and selectivity of slurry (A) is shown in Table-1.

TABLE 1

Selectivity of slurry (A) using different organic resin particles

| | | Resin A (F/M = 3.5) | Resin B (F/M = 2.5) | Resin C (F/M = 1.65) | Resin I (emulsion) | Resin J (baked powder) |
|---|---|---|---|---|---|---|
| Metal Removal Rate (MRR) (nm/min) @pH = 4.4 | Cu | 867 | 1016 | 986 | 1203 | 1085 |
| | Ta | 0.5 | 0.4 | 0.4 | 0.5 | 0.6 |
| | $SiO_2$ | 0 | 1.7 | 1.1 | 1.4 | 2.1 |

| | | Resin D (MUF) | Resin E (MPF) | Resin F (UF) | Resin G (PF) | Resin H (PUF) |
|---|---|---|---|---|---|---|
| MRR (nm/min) @pH = 4.4 | Cu | 1273 | 1109 | 1027 | 1210 | 1477 |
| | Ta | 0.3 | 0.4 | 0.7 | 0.7 | 0.5 |
| | $SiO_2$ | 5.2 | 3.2 | 3.6 | 2.0 | 5.7 |

Resins A, B, C, I, and J are melamine formaldehyde resins with various mole ratios and prepared by different methods. Resins D–H are modified melamine formaldehyde resins and other types of formaldehyde resins.

The data in Table-1 indicate that the difference in chemical composition of the resin particles can have an impact on the copper removal rate. Also, slurry (A) clearly has a high preference for removing copper versus either tantalum or silica.

Using the same procedure as set forth in Example-14, 1" discs of copper, tantalum and silica oxide were polished using slurry (B) of Example 13 with different organic resin particles, which were prepared as described in Examples 1–10. The removal rate and selectivity of slurry (B) is shown in Table-2.

The selectivity of slurry (B) using various resin particles is shown in Table-2. Slurry (B) clearly has a high preference for removing tantalum and silica versus copper. Also, the polishing selectivity can be controlled by manipulating the chemical composition of the organic abrasive particles.

TABLE 2

The selectivity of slurry (B) using different organic resin particles

| | | Resin A (F/M = 3.5) | Resin B (F/M = 2.5) | Resin C (F/M = 1.65) | Resin I (emulsion) | Resin J (baked powder) |
|---|---|---|---|---|---|---|
| MRR (nm/min) @pH = 9.0 | Cu | 15 | 8.26 | 11.6 | 16.1 | 12.6 |
| | Ta | 56 | 42.02 | 55.3 | 49.2 | 41.04 |
| | $SiO_2$ | 11 | 27.95 | 21.0 | 17.2 | 27.95 |

| | | Resin D (MUF) | Resin E (MPF) | Resin F (UF) | Resin G (PF) | Resin H (PUF) |
|---|---|---|---|---|---|---|
| MRR (nm/min) @pH = 9.0 | Cu | 33.02 | 21 | 22 | 17 | 25 |
| | Ta | 34.08 | 46 | 39 | 56 | 36 |
| | $SiO_2$ | 27.95 | 26 | 37.27 | 46.54 | 46.54 |

The surface structure of the organic resin particles is responsive to its chemical environment, particularly to pH. It will have a direct impact on the interaction between particles and surface to be polished, which, in turn, will have an impact on the polishing results such as dishing and erosion values. When a patterned wafer sample was polished as described in Example-15 using a slurry composition at various pH conditions, different dishing results were observed as shown in Table-3. This slurry composition has 3% Resin A particles (from Example-1), 3% $H_2O_2$, 1% glycine, 0.5% mM benzotriazole.

Key factors that have a great impact on the removal rate of a slurry include particle content, oxidizing agent concentration, and pH. The results shown in Table-5 highlight the relative importance of each factor. The slurry samples were prepared as described in Example-12, and the ingredients were varied and/or the pH was adjusted.

TABLE 5

Copper removal rate (Cu MRR) with varying resin content, oxidizer concentration and pH

| Resin % | 1 | 5 | 10 | 15 | | | | | | |
|---|---|---|---|---|---|---|---|---|---|---|
| Cu, MRR (nm/min) | 328 | 370 | 437 | 482 | | | | | | |
| $H_2O_2$ % | 0.00 | 0.50 | 0.75 | 1.00 | 1.25 | 1.50 | 1.75 | 2.00 | 3.00 | 5.00 | 10.00 |
| Cu, MRR (nm/min) | 13.90 | 149 | 288 | 345 | 402 | 513 | 706 | 759 | 812 | 1146 | 951 |
| pH | 2.00 | 2.99 | 4.00 | 5.40 | 6.00 | 7.01 | 8.00 | 8.40 | 9.00 | 9.80 | 11.00 |
| Cu, MRR (nm/min) | 608 | 860 | 990 | 964 | 958 | 873 | 814 | 829 | 921 | 943 | 924 |

TABLE 3

Dishing results at different pH

| | Polishing | Dishing |
|---|---|---|
| pH = 4.4 | End point | 3,350 Å |
| pH = 9.2 | End point | 642 Å |

The level of dishing for a polished 8" patterned wafer using organic abrasive particles is lower than that for a wafer using conventional inorganic particles as shown in Table-4. It is believed that the relative softness of the organic particles plays a key role in producing such a difference.

TABLE 4

Dishing results for 8" patterned wafer polished with different abrasive particles

| Aqueous Slurry Composition | Abrasive | Dishing |
|---|---|---|
| 5% Abrasive 1% Glycine 0.5 mM BTA 3% $H_2O_2$ (pH-9) | Resin A Particles (from Example 1) | 650 Å |
| | Silica | 1100 Å |

The surface quality of the polished wafer was also evaluated using Horizon Non-contact Optical Profilometer (scanning area is 268800×268800 nm). It showed that less scratching is observed on a wafer polished using organic resin particles than that using inorganic particles such as silica or alumina.

The Horizon Non-contact Optical Profilometer was obtained from Burleigh Instruments (Victor, N.Y.) and was used to study the pre- and post-polished wafer surface quality such as scratches, pits, corrosions, etc. The instrument uses phase shifting interferometric technology to provide a non-contact three dimensional measurement of the roughness of the surface from sub-nanometer to the micron scale. With appropriate vibration isolation and signal averaging, vertical resolution on the order of Å can be obtained. In contrast to atomic force microscopy, the optical profilometer is much faster and has an x-y range up to 2 mm.

In table 5, the slurry composition for the amount of resin particle versus material removal rate is 2% hydrogen peroxide, 1% ascorbic acid, 0.2% Arlasolve 200, and pH=4.4. Also, the slurry composition for the amount of hydrogen peroxide versus material removal rate is 5% organic resin particle, 1% ascorbic acid, 0.25% Arlasolve 200, and pH=4.4. In addition, the slurry composition for the pH versus material removal rate is 5% organic resin particle, 3% hydrogen peroxide, 1% glycine, 0.2% Arlasolve 200, and pH=4.4.

Example-17

Polishing of 6" copper, tantalum and silica oxide blanket wafers: copper, tantalum and silica oxide blanket wafers are polished using Westech 372 under the following conditions: wafer pressure (6 Psi); slurry flow rate (200 ml/min); platen speed and carrier speed (60 rpm). The copper wafer was polished with slurry (A) and the tantalum and silica oxide wafers were polished with slurry (B). The composition of slurry (A) is 5 w/w % Resin A particles (from Example-1), 3 w/w % $H_2O_2$ (an oxidizer), 1 w/w % glycine (a chelating agent), and the pH was set at 6. The composition of slurry (B) was the same as slurry (A) except that 1 w/w % of $SiO_2$ particles were added. After polishing, the weight loss of the wafer is measured and the average polishing rate was calculated. The surface quality of the 6" copper, tantalum and silica oxide wafer is evaluated using a Horizon Non-contact optical profilometer. The scanning size was 268800× 268800 nm. The results of these tests are tabulated in Table 6 below. The target values for MRR and Surface Roughness correspond to the threshold values which are acceptable for this experiment. As can be seen from the data, the slurries (A) and (B) of the invention, surpass the threshold values.

TABLE 6

Materials Removal Rates and Surface Quality of Polished 6" Wafers

| Substrate | Target MRR (Å/min) | Obtained MRR (Å/min) | Target Surface Roughness (Å) | Obtained Surface Roughness (Å) |
|---|---|---|---|---|
| Copper[1] | >5000 | 5600 | 15 | 8 |
| Ta[2] | >500 | 540 | 10 | 7 |

TABLE 6-continued

Materials Removal Rates and Surface Quality of Polished 6" Wafers

| Substrate | Target MRR (Å/min) | Obtained MRR (Å/min) | Target Surface Roughness (Å) | Obtained Surface Roughness (Å) |
|---|---|---|---|---|
| SiO$_2$[(2)] | <50 | 35 | 10 | 6 |

Polished with slurry (A).
Polished with slurry (B).

Another advantage of using the inventive slurry with organic resin particles is also observed in the cleaning stage. There were fewer residual resin particles left on the wafer surface than that on a wafer polished using conventional abrasive particles. Fewer scratches and less residual particles on the polished wafer will give fewer surface defects and a higher product yield.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A slurry for chemical mechanical planarization comprising 0.1–20 w/w % of abrasive particles comprising condensate organic resin in an aqueous solution; wherein the organic resin is formed by combining a substituted or unsubstituted formaldehyde, and at least one of (a) a substituted or unsubstituted melamine, (b) a substituted or unsubstituted urea, (c) a substituted or unsubstituted phenol and (d) a substituted or unsubstituted resorcinol.

2. The slurry according to claim 1, wherein the particles have a hardness of less than 250 on a Rockwell Hardness scale according to ASTM D785 and an average particle diameter of 0.05–5 microns, and wherein the slurry has a pH between 2–12.

3. The slurry according to claim 2, wherein the particles have a hardness of from 65 to 125.

4. The slurry according to claim 1 that is capable of selectively removing copper from a substrate, said slurry comprises: (1) 0.5–20 w/w % of the abrasive particles comprising the organic resin; (2) 0–10 w/w % of an oxidizing agent; (3) 0.1–5 w/w % of a chelating agent; (4) 0.1–5 w/w % of a surfactant; and (5) 0–1 w/w % of a passivation agent, each value based on the weight of the slurry composition, and the balance being soft water, wherein the slurry has a pH in a range of 2–12.

5. The slurry according to claim 4, comprising: (1) 1–5 w/w % of the abrasive particles comprising the organic resin; (2) 1–3 w/w % of the oxidizing agent; (3) 0.1–1 w/w % of the chelating agent; (4) about 0.1 w/w % of the surfactant; and (5) 0–0.05 w/w % of the passivation agent, each value based on the weight of the slurry composition, and the balance being soft water, wherein the slurry has a pH in a range of 2–6.

6. The slurry according to claim 1 that is effective for removing tantalum and/or silica from a semiconductor device, said slurry comprises: (1) 0.5–20 w/w % of the abrasive particles comprising the organic resin; (2) 0–3 w/w % of an oxidizing agent; (3) 0–3 w/w % of a chelating agent; (4) 0–2 w/w % of a surfactant; and (5) 0.1–15 w/w % of an inorganic abrasive particle, each value based on the weight of the slurry composition, the balance being soft water and the slurry has a pH of 2–12.

7. The slurry according to claim 6, comprising: (1) 1–5 w/w % of the abrasive particles comprising the organic resin; (2) 0–3 w/w % of an oxidizing agent; (3) 0–3 w/w % of a chelating agent; (4) 0–2 w/w % of a surfactant; and (5) about 1 w/w % of an inorganic abrasive particle, each value based on the weight of the slurry composition, the balance being soft water and the slurry has a pH of 9–10.

8. A method of polishing a semiconductor device, comprising polishing said device with the slurry composition according to any one of claims 1–3 and 4–7.

9. An abrasive composition for reducing the roughness of a surface of a semiconductor device, wherein the abrasive composition comprises a mixture of condensate organic abrasive particles and inorganic abrasive particles, said condensate organic abrasive particles being formed by combining a substituted or unsubstituted formaldehyde, and at least one selected from the group consisting of (a) a substituted or unsubstituted melamine, (b) a substituted or unsubstituted urea, (c) a substituted or unsubstituted phenol and (d) a substituted or unsubstituted resorcinol.

10. The abrasive particles for reducing the roughness of a surface of a semiconductor device, wherein the abrasive particles comprise a condensate organic resin formed by combining a substituted or unsubstituted formaldehyde, and at least two selected from the group consisting of (a) a substituted or unsubstituted melamine, (b) a substituted or unsubstituted urea, (c) a substituted or unsubstituted phenol and (d) a substituted or unsubstituted resorcinol.

11. The abrasive particles for reducing the roughness of a surface of a semiconductor device, wherein the abrasive particles comprise a condensate organic resin formed by combining a substituted or unsubstituted formaldehyde, and at least one selected from the group consisting of (a) a substituted or unsubstituted phenol and (b) a substituted or unsubstituted resorcinol.

* * * * *